(12) United States Patent
Leisenberger

(10) Patent No.: US 9,577,135 B2
(45) Date of Patent: Feb. 21, 2017

(54) CMOS COMPATIBLE ULTRAVIOLET SENSOR DEVICE AND METHOD OF PRODUCING A CMOS COMPATIBLE ULTRAVIOLET SENSOR DEVICE

(71) Applicant: ams AG, Unterpremstaetten (AT)

(72) Inventor: Friedrich Peter Leisenberger, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/028,010

(22) PCT Filed: Sep. 30, 2014

(86) PCT No.: PCT/EP2014/070947
§ 371 (c)(1),
(2) Date: Apr. 7, 2016

(87) PCT Pub. No.: WO2015/052044
PCT Pub. Date: Apr. 16, 2015

(65) Prior Publication Data
US 2016/0254406 A1    Sep. 1, 2016

(30) Foreign Application Priority Data
Oct. 10, 2013  (EP) .................................... 13188135

(51) Int. Cl.
*H01L 31/09*     (2006.01)
*H01L 31/0216*   (2014.01)
*H01L 31/113*    (2006.01)
*H01L 27/146*    (2006.01)
(Continued)

(52) U.S. Cl.
CPC ................ *H01L 31/09* (2013.01); *G01J 1/429* (2013.01); *H01L 21/28282* (2013.01);
(Continued)

(58) Field of Classification Search
CPC ....................................................... H01L 31/09
USPC .......................................................... 257/290
See application file for complete search history.

(56) References Cited

U.S. PATENT DOCUMENTS

| 4,590,503 A | 5/1986 | Harari et al. |
| 5,504,706 A | 4/1996 | D'Arrigo et al. |

(Continued)

FOREIGN PATENT DOCUMENTS

| EP | 0464196 A1 | 1/1992 |
| FR | 2911191 A1 | 7/2008 |

(Continued)

*Primary Examiner* — George Fourson, III
(74) *Attorney, Agent, or Firm* — McDermott Will & Emery LLP

(57) ABSTRACT

The ultraviolet sensor device comprises a semiconductor substrate, a dielectric layer above the substrate, a surface of the dielectric layer that is provided for the incidence of ultraviolet radiation, a floating gate electrode in the dielectric layer and an electrically conductive control gate electrode near the floating gate electrode. The control gate electrode is insulated from the floating gate electrode. A sensor layer is formed by an electrically conductive further layer that is electrically conductively connected to the floating gate electrode. The control gate electrode is arranged outside a region that is located between the sensor layer and the surface provided for the incidence of ultraviolet radiation. The sensor layer is discharged by incident UV radiation and can be charged or discharged electrically by charging or discharging the floating gate electrode.

15 Claims, 8 Drawing Sheets

(51) Int. Cl.
*G01J 1/42* (2006.01)
*H01L 21/28* (2006.01)
*H01L 21/3205* (2006.01)
*H01L 27/115* (2006.01)
*H01L 27/144* (2006.01)
*H01L 29/49* (2006.01)
*H01L 29/788* (2006.01)
*H01L 31/18* (2006.01)

(52) U.S. Cl.
CPC .. *H01L 21/32055* (2013.01); *H01L 27/11558* (2013.01); *H01L 27/1443* (2013.01); *H01L 27/14614* (2013.01); *H01L 27/14623* (2013.01); *H01L 27/14632* (2013.01); *H01L 29/4916* (2013.01); *H01L 29/788* (2013.01); *H01L 31/02164* (2013.01); *H01L 31/113* (2013.01); *H01L 31/182* (2013.01)

(56) References Cited

U.S. PATENT DOCUMENTS

| | | | |
|---|---|---|---|
| 5,608,243 A * | 3/1997 | Chi | H01L 27/14887 257/249 |
| 6,501,109 B1 * | 12/2002 | Chi | H01L 27/14609 257/223 |
| 6,972,457 B1 | 12/2005 | Hopper et al. | |
| 2004/0160823 A1 | 8/2004 | Owen | |
| 2005/0146934 A1 | 7/2005 | Forbes et al. | |
| 2005/0213391 A1 | 9/2005 | Lojek | |
| 2005/0230271 A1 * | 10/2005 | Levon | G01N 27/4148 205/789 |
| 2008/0218755 A1 | 9/2008 | Lojek | |
| 2010/0053386 A1 * | 3/2010 | Sizukuisi | H04N 5/3745 348/273 |
| 2013/0020477 A1 | 1/2013 | Castellan et al. | |
| 2013/0056806 A1 | 3/2013 | Kim | |
| 2015/0060965 A1 * | 3/2015 | Gidon | H01L 27/14627 257/292 |

FOREIGN PATENT DOCUMENTS

| | | |
|---|---|---|
| JP | S5740619 A | 3/1982 |
| JP | H01307627 A | 12/1989 |
| WO | 91/11026 A1 | 7/1991 |
| WO | 95/06905 A1 | 3/1995 |
| WO | 00/59032 A1 | 10/2000 |

* cited by examiner

CMOS COMPATIBLE ULTRAVIOLET SENSOR DEVICE AND METHOD OF PRODUCING A CMOS COMPATIBLE ULTRAVIOLET SENSOR DEVICE

BACKGROUND OF THE INVENTION

The wavelength of ultraviolet (UV) radiation is smaller than 400 nm. Semiconductor devices that are used for the detection of ultraviolet radiation require a voltage supply for the registration of received doses of ultraviolet radiation. An ultraviolet sensor device may also require a UV filter comprising a material that is not available in a standard CMOS process. An ultraviolet sensor device that is fully CMOS compatible is desired for an extended range of applications, especially in mobile computing devices, for instance.

JP S 57-40619 A discloses a light detection system comprising a MOSFET structure with a floating gate electrode. Charge is accumulated on the floating gate electrode by hot carrier injection generated by an application of a sufficiently high voltage between source and drain. UV irradiation causes the charge to dissipate, and this effect can be detected by an electronic circuit, because the working point of the MOSFET depends on the amount of charge stored on the gate electrode.

FR 2911191 A1 discloses a device for measuring a dose of ultraviolet radiation. The device comprises a MOSFET with a gate electrode and a floating gate electrode. A voltage is applied between the gate electrode and the drain in order to accumulate electrons on the floating gate electrode and thus increase the threshold voltage. UV irradiation causes a dissipation of the electrons, and the resulting change of the threshold voltage is detected by measuring the drain current before and after the UV irradiation.

US 2013/0020477 A1 discloses an ultraviolet radiation measurement sensor comprising an integrated circuit, a transparent window and a plurality of transistors with floating gates to be programmed by an injection of hot carriers. The transistors are arranged according to a non-volatile memory and provided with a device for programming, reading and/or erasing.

US 2008/0218755 A1 discloses semiconductor UV absorptive photometric cells comprising a floating-gate EPROM device. A central polysilicon floating gate electrode is laterally surrounded by a control gate, which has a subsurface electrode shared with an adjacent control transistor.

U.S. Pat. No. 5,504,706 A discloses a low voltage flash EEPROM memory array. The memory cells are fabricated from a single poly layer floating gate and are operated in accordance with Fowler-Nordheim tunneling.

US 2005/0213391 A1 discloses a block alterable EEPROM cell. A layer sequence comprising a tunnel oxide, a poly floating gate electrode, an oxide interlayer and a poly control gate electrode extending over the floating gate to an edge of a drain implant region are arranged on a substrate. Fowler-Nordheim tunneling is used to program and erase the cell.

WO 91/11026 A1 discloses a non-volatile electrically alterable semiconductor memory device with a re-crystallized floating gate electrode. A control gate electrode, which is insulated from the floating gate electrode, is arranged laterally, and partially overlies the floating gate electrode. The cell is programmed by channel hot electron injection and is erased by Fowler-Nordheim tunneling.

WO 00/59032 A1 discloses a non-volatile memory, which is implemented in a double polysilicon process. Channel hot electron injection onto a floating gate electrode is used for programming. The erasure of the memory cell is effected by Fowler-Nordheim tunneling of electrons from the floating gate electrode to the channel region and to the drain diffusion.

JP H01 307627 A discloses an ultraviolet-ray sensor comprising a source area, a drain area, a control gate area formed in a semiconductor substrate, and a floating gate electrode embedded in an insulator above the substrate. The floating gate electrode is exposed to ultraviolet rays.

U.S. Pat. No. 6,972,457 B1 discloses an imaging cell with an EPROM structure comprising a floating gate electrode formed from a layer of patterned polysilicon approximately 200 nm thick, which extends over an area of a control gate region formed in the substrate.

US 2008/0218755 A1 discloses semiconductor UV absorptive photometric cells comprising a floating-gate EPROM device. A central polysilicon floating gate electrode is laterally surrounded by a control gate, which has a subsurface electrode shared with an adjacent control transistor.

US 2005/0230271 A1 discloses floating gate field effect transistors for chemical and/or biological sensing. A floating gate electrode is arranged between a control gate electrode and the substrate.

SUMMARY OF THE INVENTION

The ultraviolet sensor device comprises a semiconductor substrate, a dielectric layer above the substrate, a surface of the dielectric layer being provided for the incidence of ultraviolet radiation, an electrically conductive floating gate electrode in the dielectric layer, and an electrically conductive control gate electrode near the floating gate electrode, the control gate electrode being insulated from the floating gate electrode. A sensor layer is formed by an electrically conductive further layer that is electrically conductively connected to the floating gate electrode. The control gate electrode is arranged outside a region that is located between the sensor layer and the surface provided for the incidence of ultraviolet radiation.

In embodiments of the ultraviolet sensor, the floating gate electrode comprises a polysilicon layer, and the control gate electrode is a doped well in the substrate.

Further embodiments of the ultraviolet sensor comprise a further doped well in the substrate near the floating gate electrode, an oxide layer between the doped well and the floating gate electrode, and a further oxide layer between the further doped well and the floating gate electrode. The oxide layer is thicker than the further oxide layer.

In a further embodiment the sensor layer is formed by a further polysilicon layer, which is electrically connected to the floating gate electrode.

In a further embodiment the sensor layer is formed by a metal layer or plate, which is electrically connected to the floating gate electrode and is arranged under the surface provided for the incidence of ultraviolet radiation.

Further embodiments comprise a silicide layer, the floating gate electrode comprising a polysilicon layer, and the sensor layer comprising a further polysilicon layer. The silicide layer is arranged on the further polysilicon layer between the further polysilicon layer and the surface provided for the incidence of ultraviolet radiation.

In a further embodiment the control gate electrode is a polysilicon layer, and the floating gate electrode is a further polysilicon layer, which also forms the sensor layer.

A further embodiment comprises a source region and a drain region formed in the substrate with a channel region in the substrate between the source and drain regions. The further polysilicon layer is arranged above the channel region.

A further embodiment comprises a dielectric interlayer between the channel region and the further polysilicon layer. The floating gate electrode overlies the control gate electrode at least partially.

In a further embodiment, the control gate electrode is a metal layer arranged in the vicinity of the sensor layer.

The method of producing an ultraviolet sensor device comprises the steps of applying a polysilicon layer on or above a semiconductor substrate and embedding the polysilicon layer in a dielectric layer, which comprises a surface provided for the incidence of ultraviolet radiation. An electrically conductive control gate electrode is produced. A further polysilicon layer or a metal layer is applied and embedded in the dielectric layer, so that a sensor layer is formed and the control gate electrode is arranged outside a region that is located between the sensor layer and the surface provided for the incidence of ultraviolet radiation. A floating gate electrode is formed by arranging the polysilicon layer in the vicinity of the control gate electrode and electrically connecting the polysilicon layer to the sensor layer or by arranging the further polysilicon layer in the vicinity of the control gate electrode.

In a variant of the method, the control gate electrode is formed by a doped well in the substrate.

In a further variant of the method, the sensor layer is formed by a metal layer, which is arranged under the surface provided for the incidence of ultraviolet radiation and is electrically connected to the polysilicon layer.

In a further variant of the method, the control gate electrode is produced from the polysilicon layer, the floating gate electrode is formed by the further polysilicon layer, and a dielectric interlayer is arranged between the polysilicon layer and the further polysilicon layer.

In a further variant of the method, a source region and a drain region are formed in the substrate with a channel region between the source region and the drain region. The channel region is covered by the dielectric interlayer and the polysilicon layer that is provided as a floating gate electrode. A further polysilicon layer that is provided as a control gate is arranged below or above the previous polysilicon layer.

The following is a detailed description of examples of the ultraviolet sensor device and the production method in conjunction with the appended figures.

DETAILED DESCRIPTION

The UV sensor device is basically built like an EEPROM cell, i. e. charging and discharging of the floating gate is possible by electrical means only. Discharging by electrical means during operation enables a reset function of the UV sensor device. It is possible to shift the onset of UV detection by the selection of the UV absorbing material. A feature of the device is an electric connection of a dedicated sensor layer to the floating gate electrode.

Figure 1:
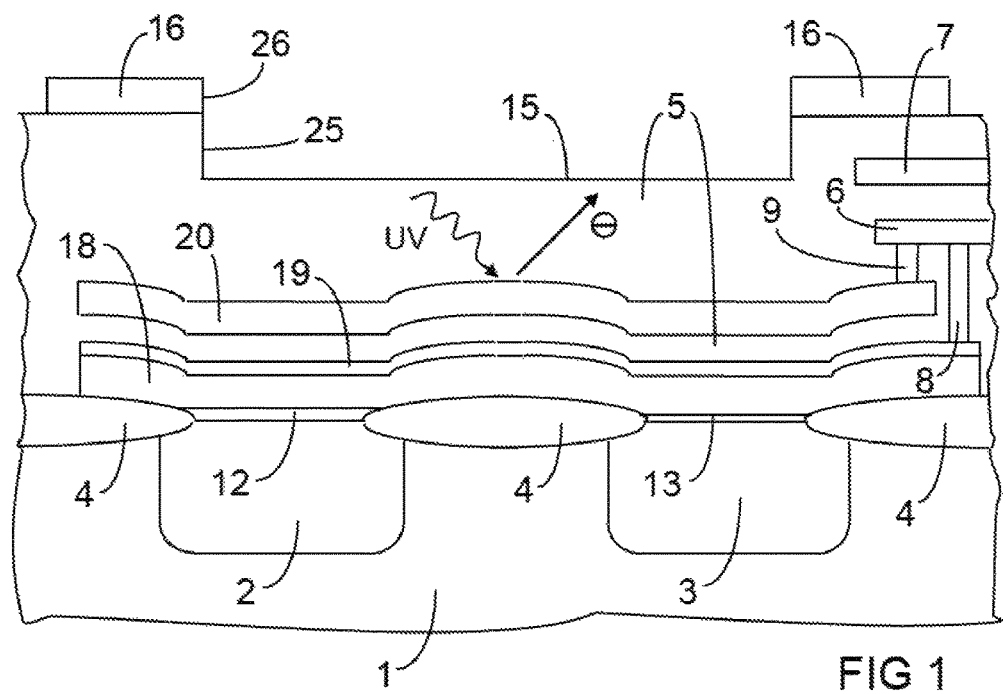
FIG. 1 is a cross section of an embodiment comprising a polysilicon layer as a floating gate electrode, a further polysilicon layer as a sensor layer and a doped well as a control gate electrode.

FIG. 1 is a cross section of an embodiment comprising a substrate 1 of semiconductor material, which may be silicon, for instance, a doped well 2 and a further doped well 3 in the substrate 1, and insulating regions 4, which may be field oxide or shallow trench isolations, for instance, and which define an active area of the substrate surface not covered by the insulating regions 4. The doped wells 2, 3 can be produced by an implantation of a dopant and have n-type or p-type conductivity. If the substrate 1 is p-type or if the wells 2, 3 are arranged in a p-type substrate well, the doped wells 2, 3 may have n-type conductivity, for instance.

A dielectric layer 5 is arranged on or above the substrate 1. A metal layer 6 and a further metal layer 7 are embedded in the dielectric layer 5. There can be any number of metal layers, which may be structured and interconnected by vias according to a wiring as it is usually provided for CMOS devices, for instance. An oxide layer 12 is present on the doped well 2, and a further oxide layer 13 is present on the further doped well 3. In the embodiment shown in FIG. 1, the oxide layer 12 is thicker than the oxide layer 13, and this is advantageous for an operation of the device with the doped well 2 functioning as a control gate electrode.

An upper surface 15 of the dielectric layer 5 is provided for the incidence of ultraviolet radiation. It is an advantage of the ultraviolet sensor device that no special UV filter is required, so that the area of the surface 15 that is provided for the incidence of ultraviolet radiation can be uncovered, as shown in the example of FIG. 1. The remaining surface area can be protected by a passivation 16, for instance.

Figure 2:
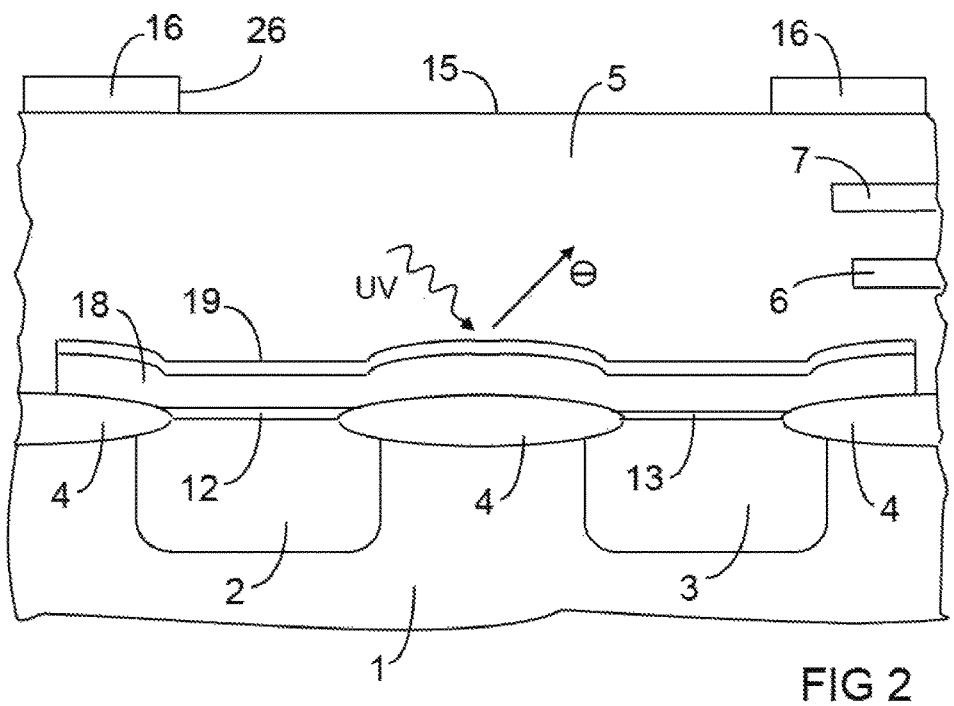
FIG. 2 is a cross section of an ultraviolet sensor device comprising a polysilicon layer as a sensor layer and a doped well as a control gate electrode.

A sensor layer is arranged above the doped wells 2, 3. The sensor layer will first be described in conjunction with the ultraviolet sensor device according to FIG. 2. In FIG. 2 the elements described above in conjunction with the embodiment according to FIG. 1 are designated with the same reference numerals. In the ultraviolet sensor device according to FIG. 2, the sensor layer is formed by a polysilicon layer 18 and an optional silicide layer 19, which may be arranged on the polysilicon layer 18 on the side facing away from the substrate 1 and which may especially be tungsten silicide, for instance. The polysilicon layer 18 or the silicide layer 19, if it is provided, is irradiated by the incident UV radiation, as indicated by the waved arrow in FIG. 2, so that electrons are emitted from the sensor layer, as indicated by the straight arrow in FIG. 2. This ultraviolet sensor device can be fabricated in a single-level polysilicon process. The sensor layer can instead be formed by any other material that is suitable for a storage of charge carriers and for a subsequent dissipation of the charge carriers by ultraviolet irradiation.

The polysilicon layer 18 functions as a floating gate electrode 18, which is isolated from the doped well 2 by the thicker oxide layer 12, shown in FIG. 2 on the left side, and from the further doped well 3 by the thinner oxide layer 13, shown in FIG. 2 on the right side. The doped well 2 is used as a control gate electrode 2. The floating gate electrode 18 can be charged by applying a sufficiently high voltage to the control gate electrode 2, while the further doped well 3 is on ground potential (0 V). This generates a current of charge carriers between the further doped well 3 and the floating gate electrode 18 through the thin further oxide layer 13 by Fowler-Nordheim tunneling. The floating gate electrode 18 can be discharged by applying a sufficiently high voltage to the further doped well 3, while the control gate electrode 2 is on ground potential.

As the ultraviolet radiation has to reach the floating gate electrode 18 or the silicide layer 19 in order to be detectable, the region above the floating gate electrode 18 and the silicide layer 19, respectively, must be free from any material that is not transparent to the ultraviolet radiation. In particular, if the passivation 16 is silicon nitride, which is not transparent to ultraviolet radiation, the passivation 16 must not cover the area of the floating gate electrode 18 where the incident ultraviolet radiation is detected. An opening 26 of the passivation 16 is appropriate in this case, as shown in FIG. 2.

The embodiment according to FIG. 1 further comprises a further polysilicon layer 20, which is arranged above the floating gate electrode 18 and functions as the sensor layer. The sensor layer of this embodiment can instead be formed by any other material that is suitable for a storage of charge carriers and for a subsequent dissipation of the charge carriers by UV irradiation.

The floating gate electrode 18 is electrically connected to the further polysilicon layer 20 via the silicide layer 19, if it is provided, and via interconnections between the layers. An interconnection 8 connects the silicide layer 19 and the metal layer 6, and a further interconnection 9 connects the metal layer 6 and the further polysilicon layer 20. A connection via the metal layer 6 is easily realized in a double-level polysilicon process. If a direct connection of the polysilicon layers 18, 20 by an interconnection that is arranged in between is feasible, this is suitable as well.

The embodiment according to FIG. 1 further comprises a recess 25 of the dielectric layer 5, which reduces the thickness of the dielectric layer 5 above the area of the further polysilicon layer 20 that is provided for the detection of ultraviolet radiation. If the passivation 16 is opaque or not sufficiently transparent for the ultraviolet radiation, it is optionally provided with an opening 26 above the sensor layer. The recess 25 in the dielectric layer 5 is optional and can be produced together with the opening 26 in the passivation 16. A similar recess may be provided in the other embodiments, which are described in the following, and in the ultraviolet sensor device according to FIG. 2.

By an appropriate selection of the material or the materials of the sensor layer, the onset of the detection of the ultraviolet radiation can be adapted to the individual requirements. The work function of tungsten silicide is approximately 4.8 eV, and the corresponding onset of the detection of radiation occurs approximately at 322 nm (onset UV-B). The work function of polysilicon is approximately 4.0 eV, and the corresponding onset of the detection of radiation occurs approximately at 390 nm (onset UV-A). The ultraviolet sensor device according to FIG. 2, wherein the sensor layer is covered with a silicide layer, is therefore suitable for the detection of UV-B and radiation with shorter wavelength, and the embodiment according to FIG. 1 is suitable for the detection of UV-A and radiation with shorter wavelength. The embodiment according to FIG. 1 can also be made suitable for the detection of UV-B and radiation with shorter wavelength if a silicide layer is applied to the further polysilicon layer 20. The ultraviolet sensor device according to FIG. 2 can also be made suitable for the detection of UV-A and radiation with shorter wavelength if the silicide layer 19 is omitted.

Figure 3:
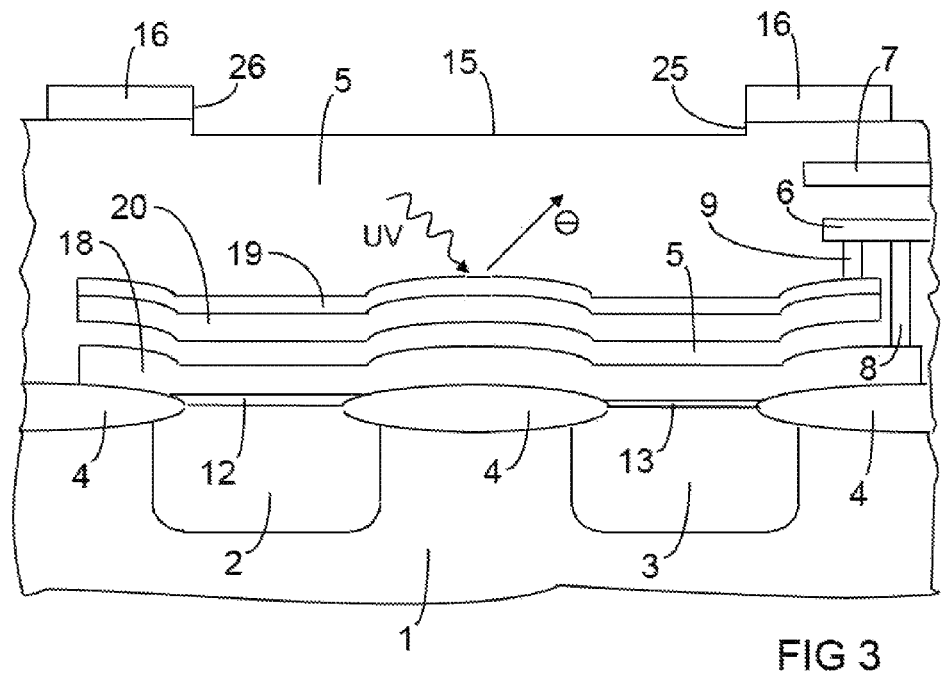
FIG. 3 is a cross section of a further embodiment comprising two polysilicon layers.

FIG. 3 is a cross section of a further embodiment of the ultraviolet sensor device comprising two polysilicon layers. Elements of the embodiment according to FIG. 3 that correspond to elements of the embodiment according to FIG. 1 are designated with the same reference numerals. The embodiment according to FIG. 3 is similar to the embodiment according to FIG. 1 except for the arrangement of the silicide layer 19 on the further polysilicon layer 20, so that the embodiment according to FIG. 3 is suitable for the detection of UV-B and radiation with shorter wavelength. The operation of the embodiment according to FIG. 3 is the same as the operation of the embodiment according to FIG. 1.

Figure 4:
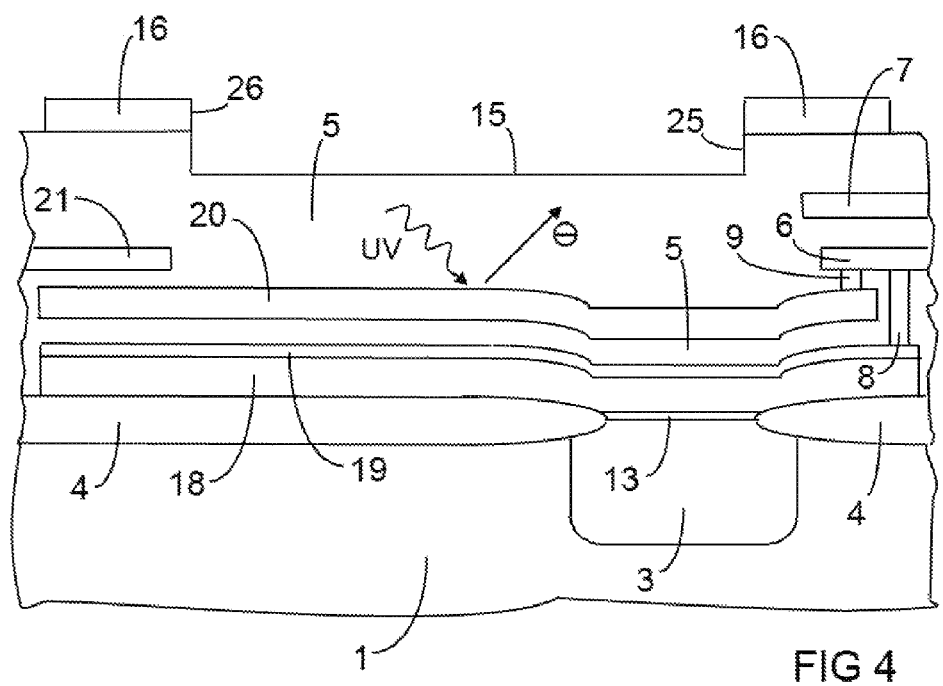
FIG. 4 is a cross section of a further embodiment comprising two polysilicon layers and a metal layer as a control gate electrode.

FIG. 4 is a cross section of a further embodiment of the ultraviolet sensor device comprising two polysilicon layers and a metal layer as a control gate electrode. Elements of the embodiment according to FIG. 4 that correspond to elements of the embodiment according to FIG. 1 are designated with the same reference numerals. The embodiment according to FIG. 4 is similar to the embodiment according to FIG. 1 except for the arrangement of the control gate electrode 21, which is formed by a metal layer. The doped well 2 can therefore be omitted. The control gate electrode 21 is arranged above the further polysilicon layer 20, which forms the sensor layer. A shallow region of the dielectric layer 5 is present between the control gate electrode 21 and the further polysilicon layer 20. The mechanism of Fowler-Nordheim-tunneling from the further doped well 3 through the further oxide layer 13 is similar to the embodiment according to FIG. 1.

Figure 5:
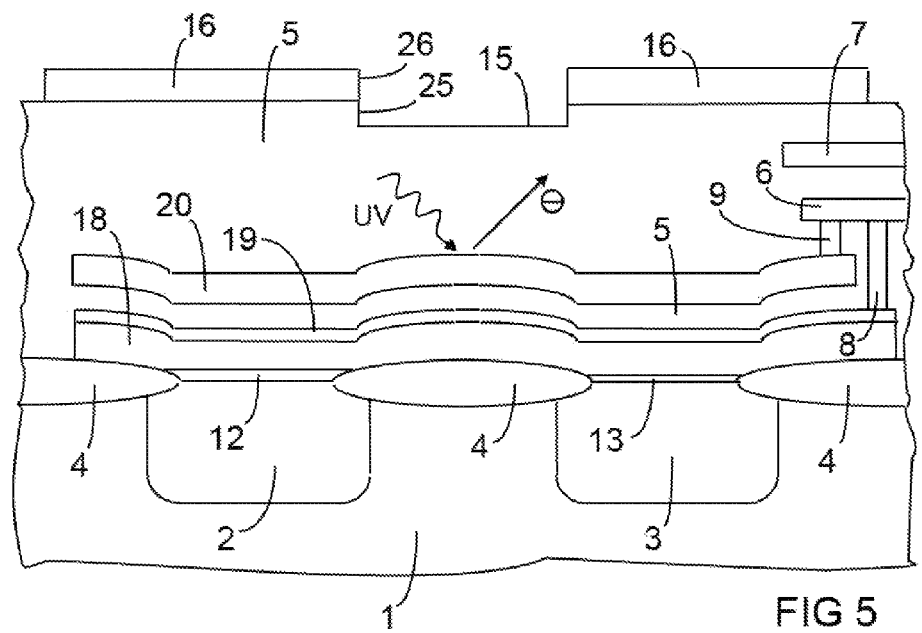
FIG. 5 is a cross section of a further embodiment comprising two polysilicon layers.

FIG. 5 is a cross section of a further embodiment of the ultraviolet sensor device. Elements of the embodiment according to FIG. 5 that correspond to elements of the embodiment according to FIG. 1 are designated with the same reference numerals. The embodiment according to FIG. 5 is similar to the embodiment according to FIG. 1 except for the dimension of the recess 25, which is smaller than in the embodiment according to FIG. 1. If the passivation 16 is a material that is opaque or not sufficiently transparent for ultraviolet radiation, like silicon nitride, for example, only ultraviolet radiation incident in the area of the opening 26 in the passivation 16 above the optional recess 25 is detected. The irradiated area can thus be defined by the dimension of the opening 26. The silicide layer 19 may be omitted or applied to the upper surface of the further polysilicon layer 20, if a detection of UV-B is desired.

Figure 6:
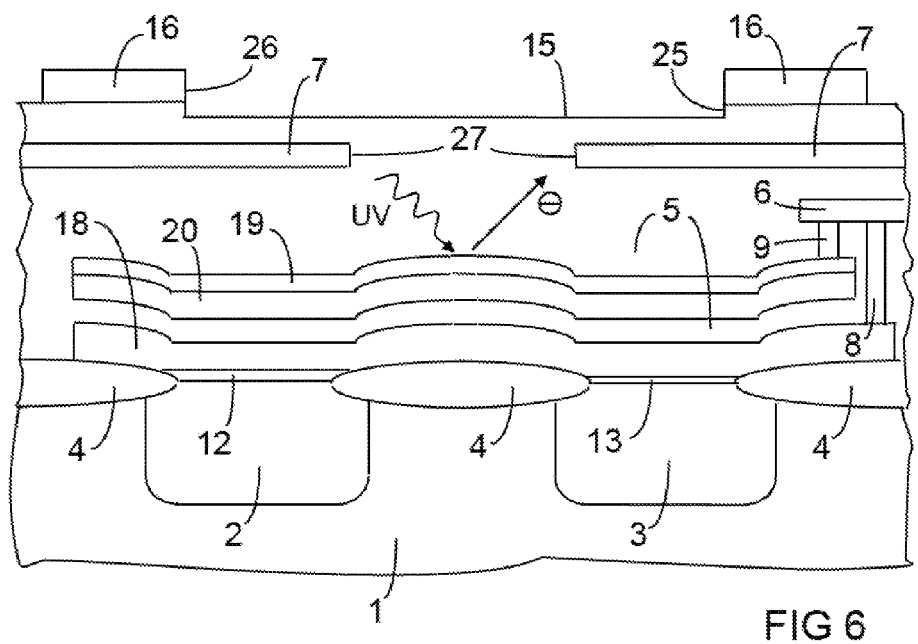
FIG. 6 is a cross section of a further embodiment comprising two polysilicon layers.

FIG. 6 is a cross section of a further embodiment of the ultraviolet sensor device. Elements of the embodiment according to FIG. 6 that correspond to elements of the embodiment according to FIG. 3 are designated with the same reference numerals. The embodiment according to FIG. 6 is similar to the embodiment according to FIG. 3 except for the arrangement of an aperture 27 formed by the further metal layer 7 above the sensor layer. As the further metal layer 7 is opaque, only ultraviolet radiation incident in the area of the aperture 27 is detected. The area of detection can thus be limited by the dimension of the aperture 27. The silicide layer 19 can be omitted or applied on the polysilicon layer 18 as in the embodiments according to FIGS. 1 and 5.

Figure 7:
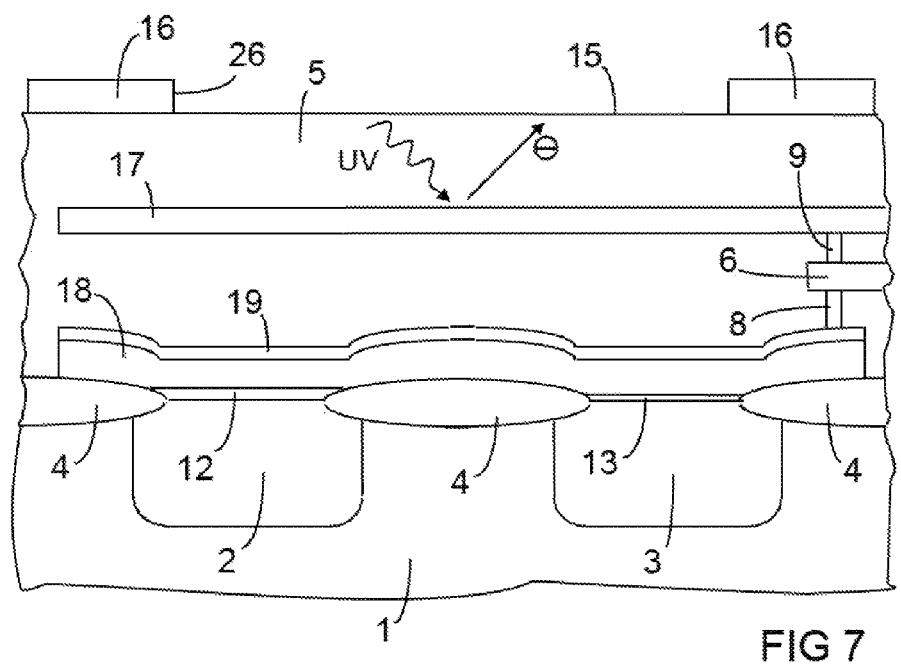
FIG. 7 is a cross section of a further embodiment comprising a metal sensor layer and a doped well as a control gate electrode.

FIG. 7 is a cross section of a further embodiment of the ultraviolet sensor device comprising a metal sensor layer and a doped well as a control gate electrode. Elements of the embodiment according to FIG. 7 that correspond to elements of the ultraviolet sensor device according to FIG. 2 are designated with the same reference numerals. The embodiment according to FIG. 7 further comprises a metal layer, especially a metal plate 17 forming the sensor layer. The metal plate 17 can be arranged in any metal level of a wiring, for example. The metal plate 17 can be dimensioned according to the requirements, and it can be arranged at any desired level within the dielectric layer 5 and, in particular, as close to the surface 15 as required. The metal plate 17 can be aluminum, for instance. Aluminum and polysilicon are equally suitable for the sensor layer, because the work functions are approximately the same.

The metal plate 17 is electrically connected to the floating gate electrode 18 via interconnections 8, 9. FIG. 7 shows the interconnection 8 that connects the silicide layer 19 to the metal layer 6, and the further interconnection 9 that connects the metal layer 6 to the metal plate 17. Similar interconnections can be provided between further metallization levels, so that the metal plate 17 can be arranged at any suitable metallization level.

The operation of the embodiment according to FIG. 7 is similar to the operation of the embodiment according to FIG. 1. Charge is transferred onto the floating gate electrode 18 and is removed from the floating gate electrode 18 by Fowler-Nordheim tunneling. To this end appropriate voltages are applied to the doped well 2 and to the further doped well 3 as described above in conjunction with FIG. 2.

Figure 8:
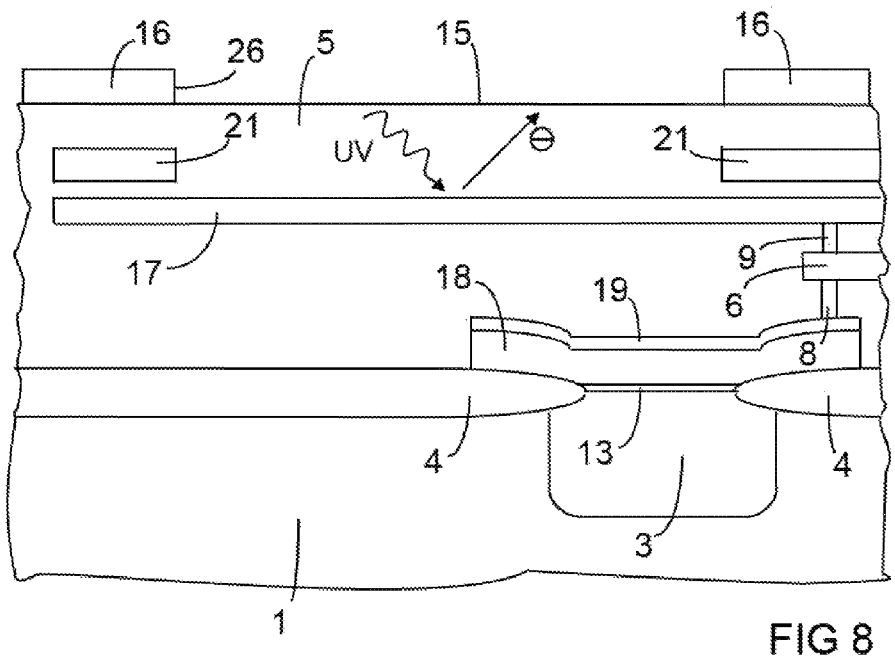
FIG. 8 is a cross section of a further embodiment comprising a metal sensor layer and a further metal layer as a control gate electrode.

FIG. 8 is a cross section of a further embodiment of the ultraviolet sensor device comprising a metal sensor layer and a further metal layer as a control gate electrode. Elements of the embodiment according to FIG. 8 that correspond to elements of the embodiment according to FIG. 7 are designated with the same reference numerals. The embodiment according to FIG. 8 is similar to the embodiment according to FIG. 7 except for the arrangement of the control gate electrode 21, which is formed by a metal layer. The doped well 2 can therefore be omitted. The control gate electrode 21 is arranged above the metal plate 17, which forms the sensor layer. A shallow region of the dielectric layer 5 is present between the control gate electrode 21 and the metal plate 17. The mechanism of Fowler-Nordheim-tunneling from the further doped well 3 through the further oxide layer 13 is similar to the embodiment according to FIG. 7.

Figure 9:
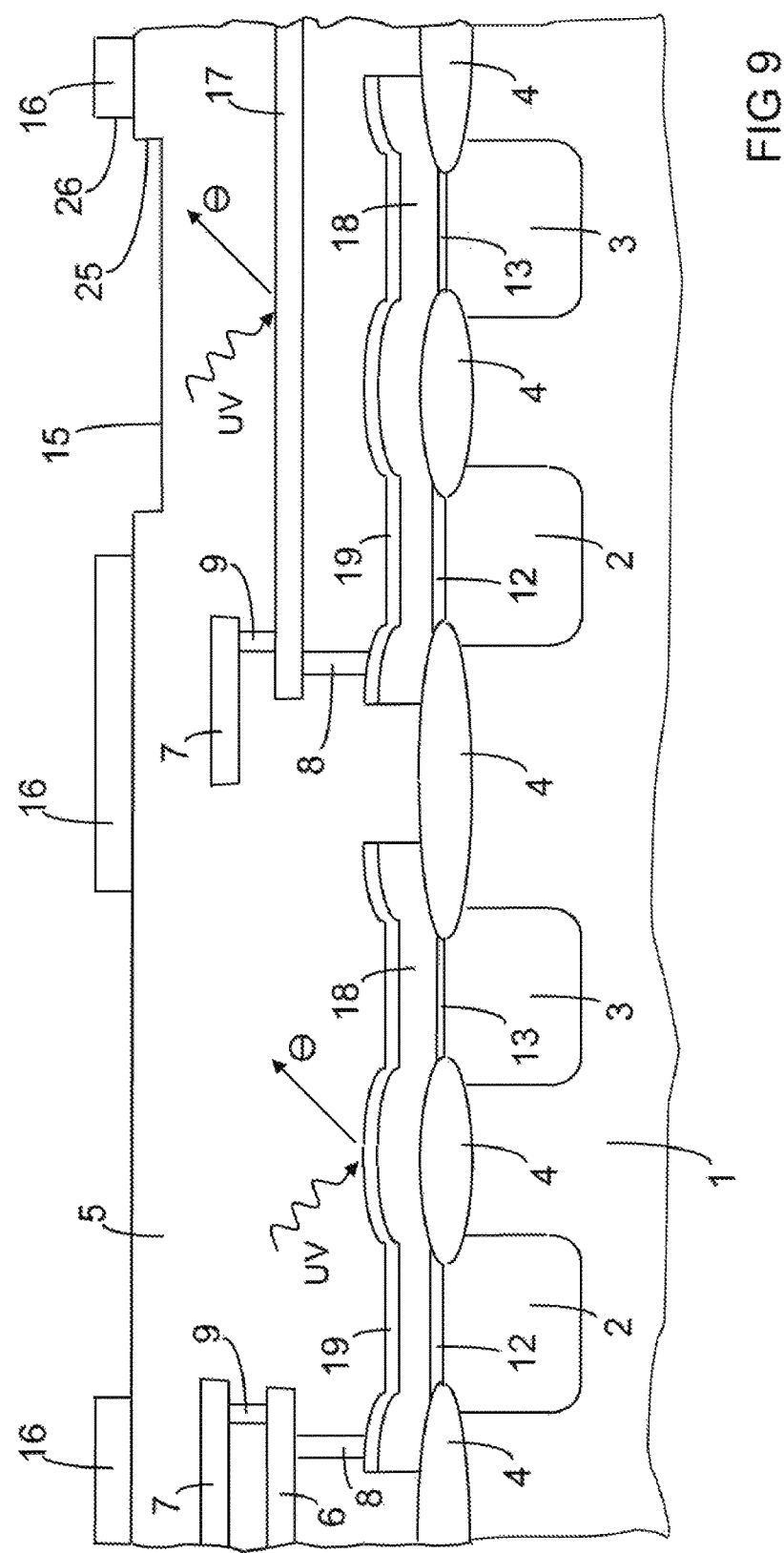
FIG. 9 is a cross section of a further embodiment combining the ultraviolet sensor devices of FIGS. 2 and 7.

FIG. 9 is a cross section of a further embodiment of the ultraviolet sensor device comprising a sensor component according to FIG. 2 and a further sensor component with a metal sensor layer according to FIG. 7. Elements of the embodiment according to FIG. 9 that correspond to elements of the devices according to FIGS. 2 and 7 are designated with the same reference numerals. The embodiment according to FIG. 9 combines ultraviolet sensor devices that are suitable for the detection of UV-A and for the detection of UV-B, respectively.

The device structure shown on the left of FIG. 9 comprises a doped well 2, a further doped well 3, insulating regions 4, an oxide layer 12 on the doped well 2, a further oxide layer 13 on the further doped well 3, a sensor layer formed by a polysilicon layer 18 covered with an optional silicide layer 19, a dielectric layer 5 on or above the substrate 1, a metal layer 6 and a further metal layer 7 embedded in the dielectric layer 5, an interconnection 8 connecting the polysilicon layer 18 via the silicide layer 19 with the metal layer 6, and a further interconnection 9 connecting the metal layer 6 and the further metal layer 7. There can be any number of metal layers, which may be structured and interconnected by vias according to a wiring as it is usually provided for CMOS devices, for instance.

The device structure shown on the right of FIG. 9 comprises a doped well 2, a further doped well 3, insulating regions 4, an oxide layer 12 on the doped well 2, a further oxide layer 13 on the further doped well 3, a polysilicon layer 18, an optional silicide layer 19, a dielectric layer 5 on or above the substrate 1, a metal plate 17 provided as a sensor layer embedded in the dielectric layer 5, a further metal layer 7 embedded in the dielectric layer 5, an interconnection 8 connecting the polysilicon layer 18 via the silicide layer 19 with the metal plate 17, and a further interconnection 9 connecting the metal plate 17 and the further metal layer 7.

If a passivation 16 is provided, it may comprise openings 26 above the sensor layers. A recess 25, which is shown only for the device structure on the right of FIG. 9, may optionally be provided in the dielectric layer 5 above any of the relevant sensor layers.

FIG. 9 shows how the ultraviolet sensor devices can be applied to integrate sensor components that are suitable for the detection of ultraviolet radiation belonging to different wavelength ranges. In a similar fashion, any combination of the ultraviolet sensor devices described above or in the following can be integrated, in particular together with integrated circuits like CMOS circuits, for instance. The ranges of sensitivity can individually be provided for each integrated sensor component by a suitable selection of the materials of the sensor layers.

Such a combination may comprise a sensor layer having a silicide layer provided for the incidence of radiation and a further sensor layer having no silicide layer. The combination may comprise a sensor layer formed from polysilicon and a further sensor layer formed by a metal layer. The combination may comprise a sensor layer formed by an electrically conductive further layer connected to the floating gate electrode and a further sensor layer that is directly formed by a further floating gate electrode layer. The sensitivities of the combined sensors may be adapted to UV-A and to UV-B, for example, or to other wavelength ranges.

Figure 10:
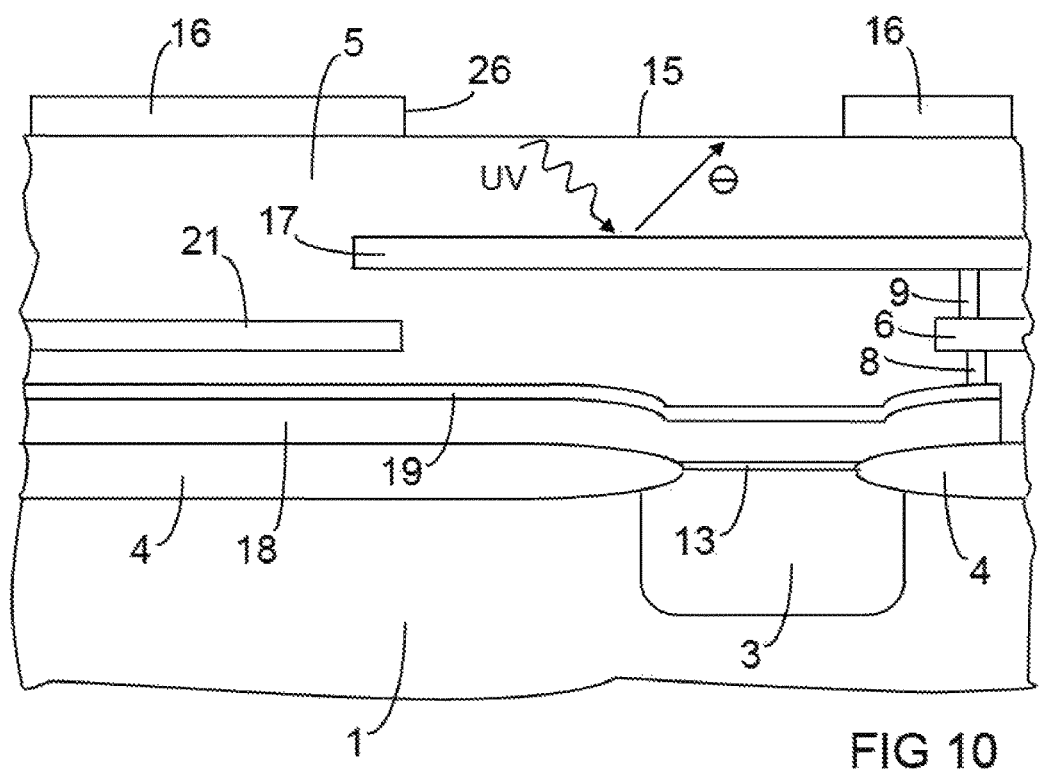
FIG. 10 is a cross section of a further embodiment comprising a metal sensor layer and a further metal layer as a control gate electrode.

FIG. 10 is a cross section of a further embodiment of the ultraviolet sensor device comprising a metal sensor layer and a further metal layer as a control gate electrode. Elements of the embodiment according to FIG. 10 that correspond to elements of the embodiment according to FIG. 8 are designated with the same reference numerals. The metal plate 17 is provided as the sensor layer and is connected with the floating gate electrode 18 via the interconnection 8, metal layer 6 and further interconnection 9 (and via the silicide layer 19, if it is provided). The embodiment according to FIG. 10 further comprises a control gate electrode 21 formed by a further metal layer arranged above an extended portion of the floating gate electrode 18. A thin region of the dielectric layer 5 is present between the control gate electrode 21 and the polysilicon layer 18. The doped well 2 providing a control gate electrode in some of the described embodiments can be omitted in the embodiment according to FIG. 10. The polysilicon layer 18 can be covered with a silicide layer 19 as in the devices according to FIGS. 1, 2, 4, 5, 7 and 8. The silicide layer 19, which is shown in FIG. 10, can instead be omitted. The mechanism of Fowler-Nordheim-tunneling from the further doped well 3 through the further oxide layer 13 is similar to the device according to FIG. 2.

Figure 11:
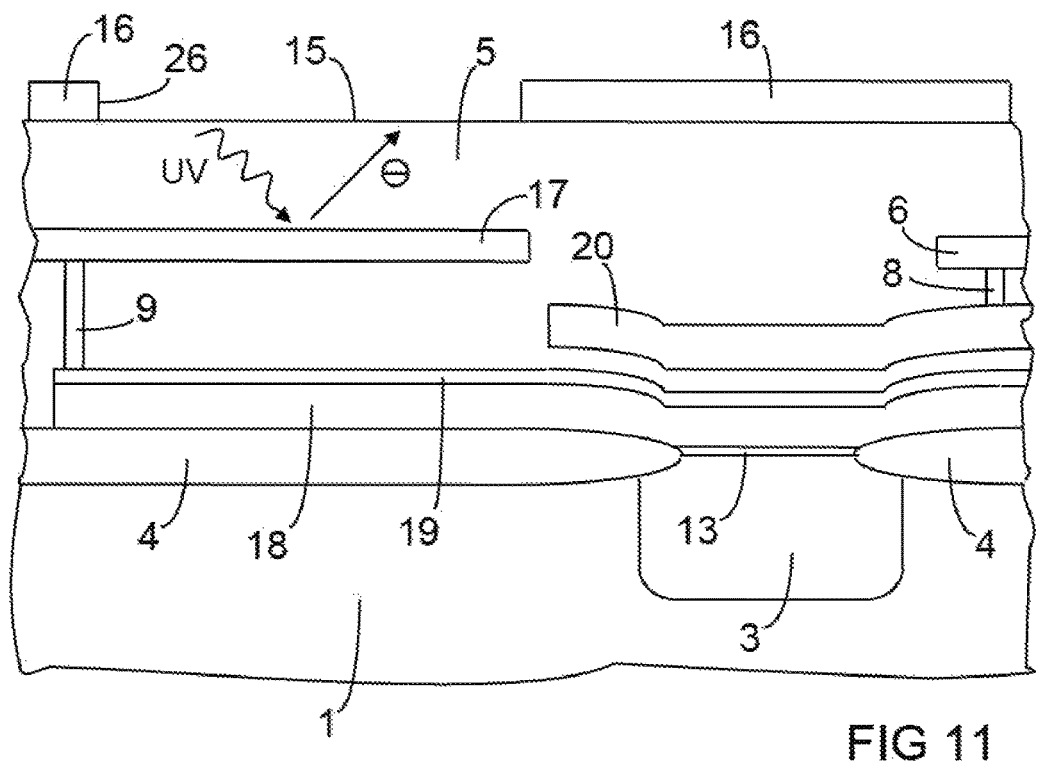
FIG. 11 is a cross section of a further embodiment comprising a metal sensor layer and a further polysilicon layer as a control gate electrode.

FIG. 11 is a cross section of a further embodiment of the ultraviolet sensor device comprising a metal sensor layer and a further polysilicon layer as a control gate electrode. Elements of the embodiment according to FIG. 11 that correspond to elements of the embodiment according to FIG. 10 are designated with the same reference numerals. The metal plate 17 is provided as the sensor layer and is connected with the floating gate electrode 18 via the further interconnection 9 (and via the silicide layer 19, if it is provided). The embodiment according to FIG. 11 further comprises a control gate electrode formed by a portion of the further polysilicon layer 20 arranged above the floating gate electrode 18. A thin region of the dielectric layer 5 is present between the polysilicon layer 18 and the further polysilicon layer 20. The doped well 2 can be omitted. The polysilicon layer 18 can be covered with a silicide layer 19 as in the embodiment according to FIG. 10. The silicide layer 19, which is shown in FIG. 11, can instead be omitted. The mechanism of Fowler-Nordheim-tunneling from the further doped well 3 through the further oxide layer 13 is similar to the device according to FIG. 2.

Figure 12:
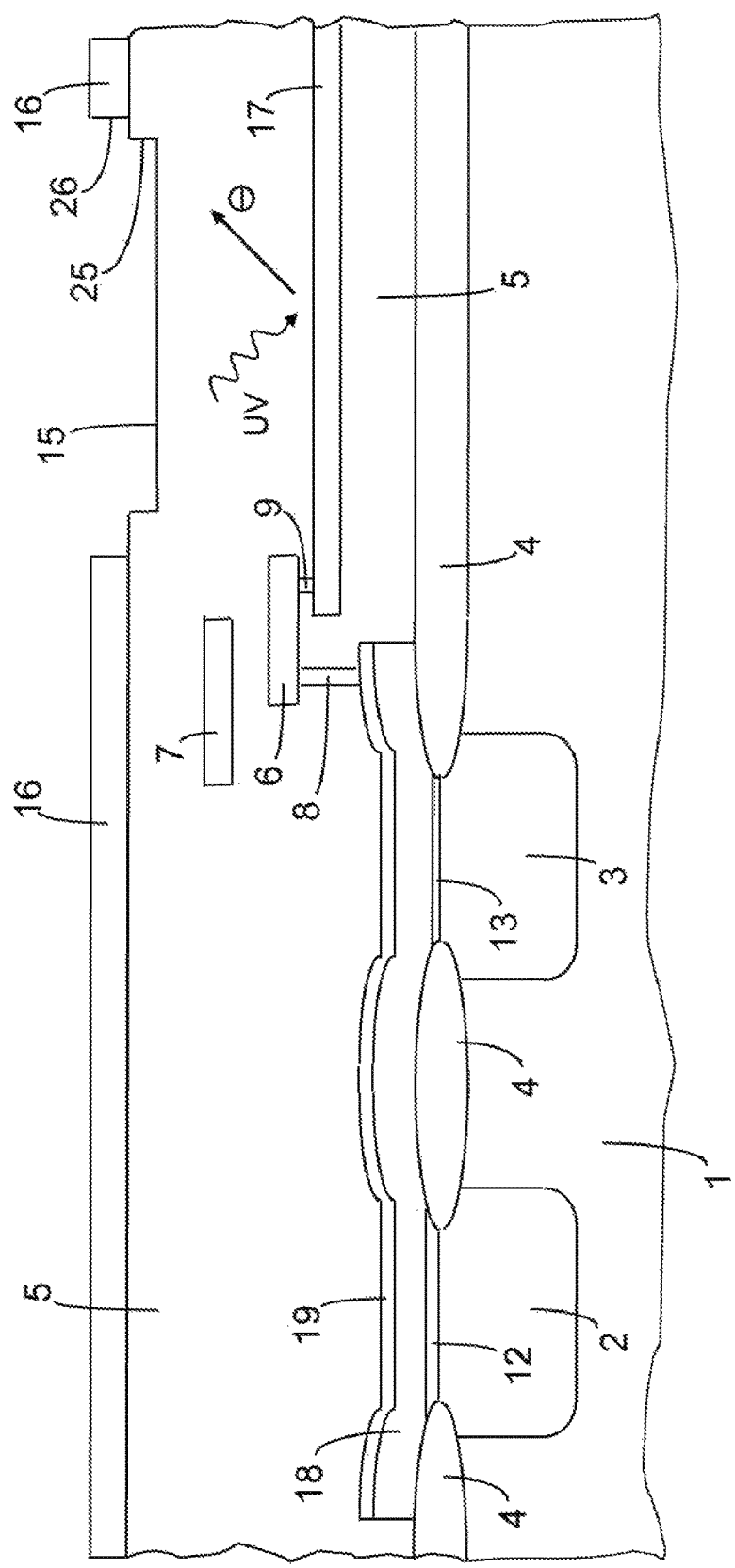
FIG. 12 is a cross section of a further embodiment comprising a metal sensor layer and a doped well as a control gate electrode.

FIG. 12 is a cross section of a further embodiment of the ultraviolet sensor device. Elements of the embodiment according to FIG. 12 that correspond to elements of the embodiment according to FIG. 7 are designated with the same reference numerals. The embodiment according to FIG. 12 is similar to the embodiment according to FIG. 7 except that the metal plate 17 forming the sensor layer is not arranged above the floating gate electrode 18 but in a region that is lateral with respect to the floating gate electrode 18. The passivation 16 can be provided with an opening 26 above the metal plate 17 to allow incident ultraviolet radiation reach the metal plate 17, and the dielectric layer 5 may be recessed above the metal plate 17 as indicated in FIG. 12. In the example of FIG. 12, the optional recess 25 is slightly smaller than the opening 26, but the recess 25 may instead have the same lateral size as the opening 26.

Figure 13:
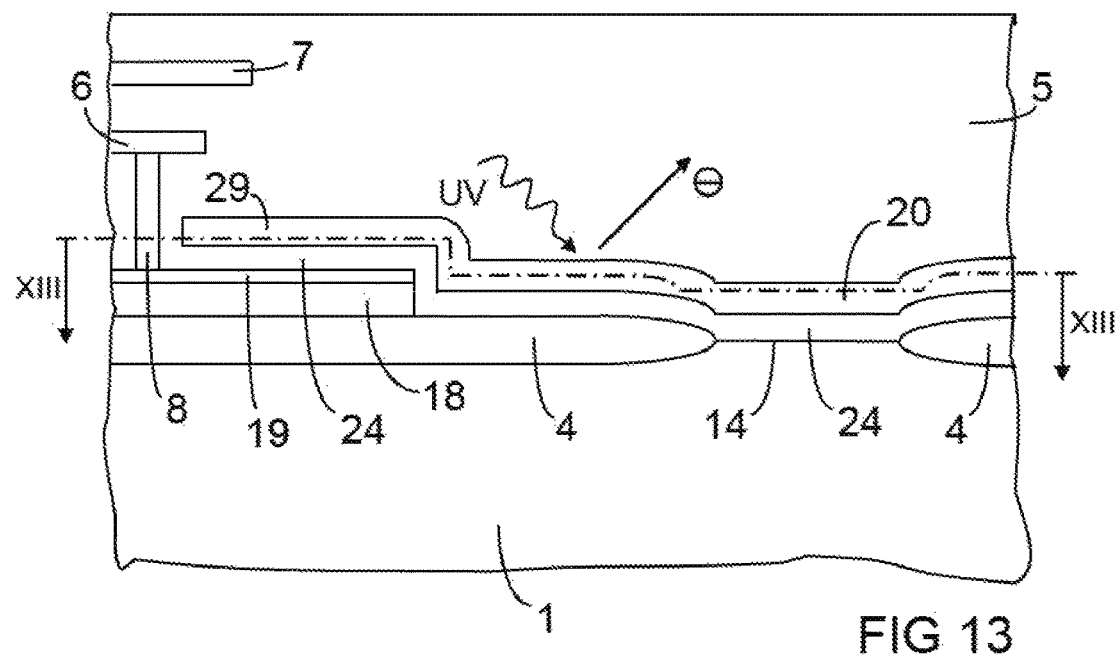
FIG. 13 is a cross section of a further embodiment comprising polysilicon layers as sensor layer, floating gate electrode and control gate electrode.

FIG. 13 is a cross section of a further embodiment of the ultraviolet sensor device comprising two polysilicon layers as sensor layer, floating gate electrode and control gate electrode. Elements of the embodiment according to FIG. 13 that correspond to elements of the embodiment according to FIG. 1 are designated with the same reference numerals. In the embodiment according to FIG. 13, the control gate electrode 18 is produced from the polysilicon layer 18, which may optionally be covered by a silicide layer 19. An interconnection 8 may electrically connect the control gate electrode 18 to the metal layer 6.

The sensor layer is formed by a portion of the further polysilicon layer 20, which is also provided as the floating gate electrode. The further polysilicon layer 20 may optionally be covered with a silicon layer at least in an area of the further polysilicon layer 20 that is provided for the incidence of radiation that is to be detected. An elevated portion 29 of the further polysilicon layer 20 overlaps a portion of the control gate electrode 18 and thus forms the floating gate electrode. The dielectric interlayer 24 between the control gate electrode 18 and the floating gate electrode 29 may be a portion of the dielectric layer 5, in which the further polysilicon layer 20 is embedded. The further polysilicon layer 20 covers an active area 14 of the substrate surface outside the area of the insulating regions 4. The dielectric interlayer 24 forms a gate dielectric between the further polysilicon layer 20 and the substrate 1 in the active area 14. The thickness of the dielectric interlayer 24 is adapted to enable hot carriers to be injected from the substrate 1 into the further polysilicon layer 20.

Figure 14:
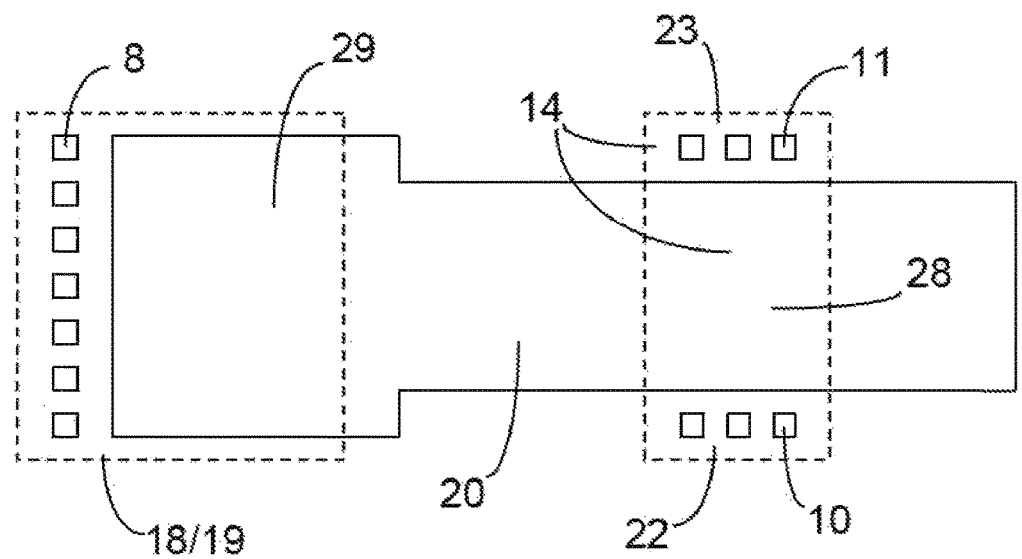
FIG. 14 is a cross-sectional top view of the embodiment shown in FIG. 13.

FIG. 14 is a cross-sectional top view of the embodiment shown in FIG. 13. The position of the cross section of the top view shown in FIG. 14 is indicated in FIG. 13 by the dash-dotted line. FIG. 14 shows the overlap of the elevated portion 29 of the further polysilicon layer 20 forming the floating gate electrode with the control gate electrode 18 and optionally with the silicide layer 19, which may be provided with the interconnections 8. A source region 22, which can be provided with source connections 10, and a drain region 23, which can be provided with drain connections 11, are formed in the substrate 1. Between the source region 22 and the drain region 23 there is a channel region 28, which is overlapped by the further polysilicon layer 20. Thus a transistor structure is formed in the active area 14.

The described transistor structure can be used to read out the ultraviolet sensor device. If the substrate 1 is p-type or if the source region 22 and the drain region 23 are arranged in a p-type substrate well, the transistor structure is an n-channel transistor. If the further polysilicon layer 20 extends over an n-doped region, it is instead possible to use a separate p-channel read-out transistor (not shown in the figures).

The transistor structure shown in FIG. 14 can be used to charge the further polysilicon layer 20 including the floating gate electrode 29 by hot electron injection from the channel region 28 (CHE injection). To this end a positive voltage of several volts is applied to the control gate electrode 18 and to the drain region 23, while the source region 22 and the substrate 1 are on ground potential (0 V). The thickness of the dielectric interlayer 24 is suitably adapted for this purpose.

The present invention has the advantage that incident doses of ultraviolet radiation are registered in a cumulative way. Thus an integration of single measurements by means of an integrated circuit is avoided. Ultraviolet radiation can be measured and the measurements can be added without power supply, because the dissipation of charge carriers from the sensor layer takes place without application of an external voltage. The ultraviolet sensor device does not need a filter, since visible light, which is not to be detected, does not have the energy that is necessary to release electrons from the floating gate electrode. Hence the incidence of visible light does not affect the state of the ultraviolet sensor device. Further advantages are the easy implementation of the described ultraviolet sensor device in a CMOS process and the possibility to define the onset of radiation detection by proper selection of the irradiated material.

The invention claimed is:
1. An ultraviolet sensor device, comprising:
a semiconductor substrate;
a dielectric layer above the substrate, a surface of the dielectric layer being provided for the incidence of ultraviolet radiation;
a floating gate electrode in the dielectric layer; and
a control gate electrode near the floating gate electrode, the control gate electrode being insulated from the floating gate electrode;
a sensor layer being formed by an electrically conductive further layer (17, 20) connected to the floating gate electrode; and
the control gate electrode being arranged outside a region that is located between the sensor layer and the surface provided for the incidence of ultraviolet radiation.

2. The ultraviolet sensor device of claim 1, wherein the floating gate electrode comprises a polysilicon layer, and the control gate electrode is a doped well in the substrate.

3. The ultraviolet sensor device of claim 2, further comprising:
a further doped well in the substrate near the floating gate electrode;
an oxide layer between the doped well and the floating gate electrode; and
a further oxide layer between the further doped well and the floating gate electrode, wherein
the oxide layer is thicker than the further oxide layer.

4. The ultraviolet sensor device of claim 2, wherein the sensor layer is formed by a further polysilicon layer, which is electrically connected to the floating gate electrode.

5. The ultraviolet sensor device of claim 1, further comprising:
the sensor layer is formed by a metal plate, which is electrically connected to the floating gate electrode and is arranged under the surface provided for the incidence of ultraviolet radiation.

6. The ultraviolet sensor device of claim 1, further comprising:
the floating gate electrode comprising a polysilicon layer;
the sensor layer comprising a further polysilicon layer; and
a silicide layer, which is arranged on the further polysilicon layer between the further polysilicon layer and the surface provided for the incidence of ultraviolet radiation.

7. The ultraviolet sensor device of claim 1, wherein
the control gate electrode is a polysilicon layer; and
the floating gate electrode is a portion of a further polysilicon layer, which also forms the sensor layer.

8. The ultraviolet sensor device of claim 7, further comprising:
a source region and a drain region formed in the substrate;
a channel region in the substrate between the source region and the drain region; and
the further polysilicon layer being arranged above the channel region.

9. The ultraviolet sensor device of claim 8, further comprising:
a dielectric interlayer between the channel region and the further polysilicon layer;
the floating gate electrode overlying the control gate electrode at least partially.

10. The ultraviolet sensor device of claim 1, wherein the control gate electrode is a metal layer arranged in the vicinity of the sensor layer.

11. A method of producing an ultraviolet sensor device, comprising:
applying a polysilicon layer on or above a semiconductor substrate;
embedding the polysilicon layer in a dielectric layer, which comprises a surface provided for the incidence of ultraviolet radiation;
producing an electrically conductive control gate electrode;
applying a further polysilicon layer or a metal layer and embedding the further polysilicon layer or the metal layer in the dielectric layer, so that a sensor layer is formed and the control gate electrode is arranged outside a region that is located between the sensor layer and the surface provided for the incidence of ultraviolet radiation, and forming a floating gate electrode by arranging the polysilicon layer in the vicinity of the control gate electrode and electrically connecting the polysilicon layer to the sensor layer or by arranging the further polysilicon layer in the vicinity of the control gate electrode.

12. The method according to claim 11, further comprising:
forming the control gate electrode by a doped well in the substrate.

13. The method according to claim 11, further comprising:
forming the sensor layer by a metal layer, which is arranged under the surface provided for the incidence of ultraviolet radiation and is electrically connected to the polysilicon layer.

14. The method according to claim 11, further comprising:
the control gate electrode being produced from the polysilicon layer;
the floating gate electrode being formed by the further polysilicon layer; and
a dielectric interlayer being arranged between the polysilicon layer and the further polysilicon layer.

15. The method according to claim 14, further comprising:
forming a source region and a drain region in the substrate with a channel region between the source region and the drain region; and
the dielectric interlayer and the further polysilicon layer being arranged above the channel region.

* * * * *